US012573814B2

(12) United States Patent
Abraham

(10) Patent No.: US 12,573,814 B2
(45) Date of Patent: Mar. 10, 2026

(54) CAPACITIVE COUPLING FOR OPTICAL OR LASER DIODES

(71) Applicant: SATIUS HOLDING, LLC, Highland, MD (US)

(72) Inventor: Charles Abraham, Fulton, MD (US)

(73) Assignee: SATIUS HOLDING, LLC, Highland, MD (US)

( * ) Notice: Subject to any disclaimer, the term of this patent is extended or adjusted under 35 U.S.C. 154(b) by 841 days.

(21) Appl. No.: 17/882,237

(22) Filed: Aug. 5, 2022

(65) Prior Publication Data

US 2024/0047938 A1 Feb. 8, 2024

(51) Int. Cl.
| | |
|---|---|
| *H01S 5/042* | (2006.01) |
| *H02J 50/05* | (2016.01) |
| *H03H 7/38* | (2006.01) |
| *H05B 45/30* | (2020.01) |

(52) U.S. Cl.
CPC .............. *H01S 5/042* (2013.01); *H02J 50/05* (2016.02); *H03H 7/38* (2013.01); *H05B 45/30* (2020.01)

(58) Field of Classification Search
CPC ........ H01S 5/042; H01S 5/0427; H02J 50/05; H03H 7/38; H03H 7/0123; H03H 7/40; H03H 2001/005; H05B 45/30; H01J 37/321; H01J 37/32183; H01J 37/32339
See application file for complete search history.

(56) References Cited

U.S. PATENT DOCUMENTS

| | | | | |
|---|---|---|---|---|
| 5,361,156 A | * | 11/1994 | Pidgeon | H04B 10/2507 |
| | | | | 398/193 |
| 5,444,564 A | * | 8/1995 | Newberg | H01S 5/06832 |
| | | | | 333/32 |

| | | | | |
|---|---|---|---|---|
| 6,104,707 A | | 8/2000 | Abraham | |
| 6,711,385 B1 | * | 3/2004 | Abraham | H04B 1/18 |
| | | | | 455/280 |
| 9,435,961 B2 | | 9/2016 | Jiang | |
| 10,883,874 B2 | | 1/2021 | Cho et al. | |

(Continued)

FOREIGN PATENT DOCUMENTS

WO       WO-2006095332 A1 *  9/2006  ............. H01S 5/042

OTHER PUBLICATIONS

International Search Report and Written Opinion issued Nov. 9, 2023 in International Application No. PCT/US23/28845.

(Continued)

*Primary Examiner* — John W Poos
(74) *Attorney, Agent, or Firm* — Panitch Schwarze Belisario & Nadel LLP

(57)                ABSTRACT

Aspects of the present disclosure may address the problem of coupling a radio-frequency (RF) input signal to a light-frequency emitting diode, where the output impedance of the device providing the input signal and the diode input impedance differ. A coupler according to aspects of the present disclosure may be a capacitive coupler that may take the form of parallel concentric coils, which may be comprised of wire or metal plate coils, or parallel plates, connected in series with a variable capacitive element. According to a further aspect of the present disclosure, parallel concentric coils and parallel plates may be arranged in parallel, and the input signal to the coupler may be switched to one or the other. The switching may be automated, based on frequency content or amplitude of the input signal.

18 Claims, 7 Drawing Sheets

(56)                    References Cited

U.S. PATENT DOCUMENTS

| | | |
|---|---|---|
| 11,328,839 B1 | 5/2022 | Kummer et al. |
| 11,330,716 B2 | 5/2022 | Park et al. |
| 11,341,306 B1 | 5/2022 | Wang et al. |
| 2004/0258115 A1* | 12/2004 | Murata .................. H01S 5/042 |
| | | 372/38.07 |
| 2007/0236148 A1 | 10/2007 | Yamazawa et al. |
| 2017/0230028 A1 | 8/2017 | Gamal El Din et al. |
| 2018/0123566 A1 | 5/2018 | Sharma |
| 2022/0190793 A1 | 6/2022 | Chen et al. |

OTHER PUBLICATIONS

Data Sheet for "FH756/SFH756V Plastic Fiber Optic Transmitter Diode Plastic Connector Housing," Copyright © 2007, Avago Technologies, 6 pages.
"SN5545xB, SN7545xB Dual-Peripheral Drivers for High-Current, High-Speed Switching," Copyright © 1967-2017, Texas Instruments Incorporated, SLRS021D, Dec. 1967—Revised Jan. 2017, 32 pages.
Data Sheet for "SFH757/SFH757V Transmitter for Polymer Optical Fiber Applications," Copyright © 2005-2011, Avago Technologies, 4 pages.

* cited by examiner

CAPACITIVE COUPLING FOR OPTICAL OR LASER DIODES

FIELD

Various aspects of the present disclosure may relate to the use of capacitive means by which to couple signals for driving diodes. More particularly, such capacitive coupling means may be used to drive diodes that emit various wavelengths of light, such as, optical diodes or laser diodes.

BACKGROUND

Diodes capable of emitting light energy are useful in many situations. Optical diodes may be used, for example, for communicating over fiber-optic cables. Laser diodes may have optical fiber communication, free-space communication, and range-finding applications, or more high-powered laser diodes may be used for such purposes as industrial cutting devices, e.g., for making precision cuts, or for power transmission, or even, perhaps, military applications.

An issue that arises when using such diodes is how to couple the driving signal (or signals) to the diode. Many conventional matching elements or coupling schemes result in large power losses, thus decreasing the power-efficiency of the overall system.

Therefore, it may be desirable to couple signals to diodes by using devices that result in lower power losses than with conventional matching elements or coupling schemes.

SUMMARY

Various aspects of the present disclosure may relate to a driver coupling circuit based on parallel coils or plates with non-conductive, non-magnetic cores that may be used to perform impedance matching for driving a light energy emitting diode, e.g., but not limited to, an optical diode, a light-emitting diode (LED), or a laser diode.

BRIEF DESCRIPTION OF THE DRAWINGS

Various aspects of this disclosure will now be described in detail in conjunction with the accompanying drawings, in which.

DETAILED DESCRIPTION

Most RF or digital or analog driver circuits are designed for output with a 50Ω impedance (sometimes other imped-ance levels may be used, but they are generally standard values, such as 50Ω). As an example, Texas Instruments SN5545xB or SN7545xB drivers are designed with a 50Ω, output impedance. See, e.g., Section 7.5 of *Texas Instru-ments, SN5545xB, SN7545xB Dual-Peripheral Drivers for High-Current, High-Speed Switching*, Revised January 2017, and incorporated by reference herein. Radio frequency (RF) power amplifiers are typically designed with an output impedance of 50Ω. This may work for most devices to be driven by such circuits, which typically are designed with a 50Ω input impedance. However, light energy emitting diodes are different.

A typical diode may have an input impedance value of 10Ω-40Ω, while a laser diode may have a typical input impedance of about 0.5n. Additionally, at least in the case of a laser diode, the input impedance may be much higher initially, e.g., on the order of 20Ω, and may then reach the lower 0.5Ω value after an initial turn-on period. The result-ing mismatches in impedance may result in large percent-ages of power loss. For example, with a 50Ω driver output impedance and a 0.5Ω diode input impedance, the power loss may be 80-90%. This power may be dissipated in the form of heat, which may have detrimental effects in addition to simply a loss of power. Therefore, aspects of the present disclosure may be directed to apparatus that may provide a coupling that reduces the power loss/dissipation from such impedance mismatches.

Figure 1A:
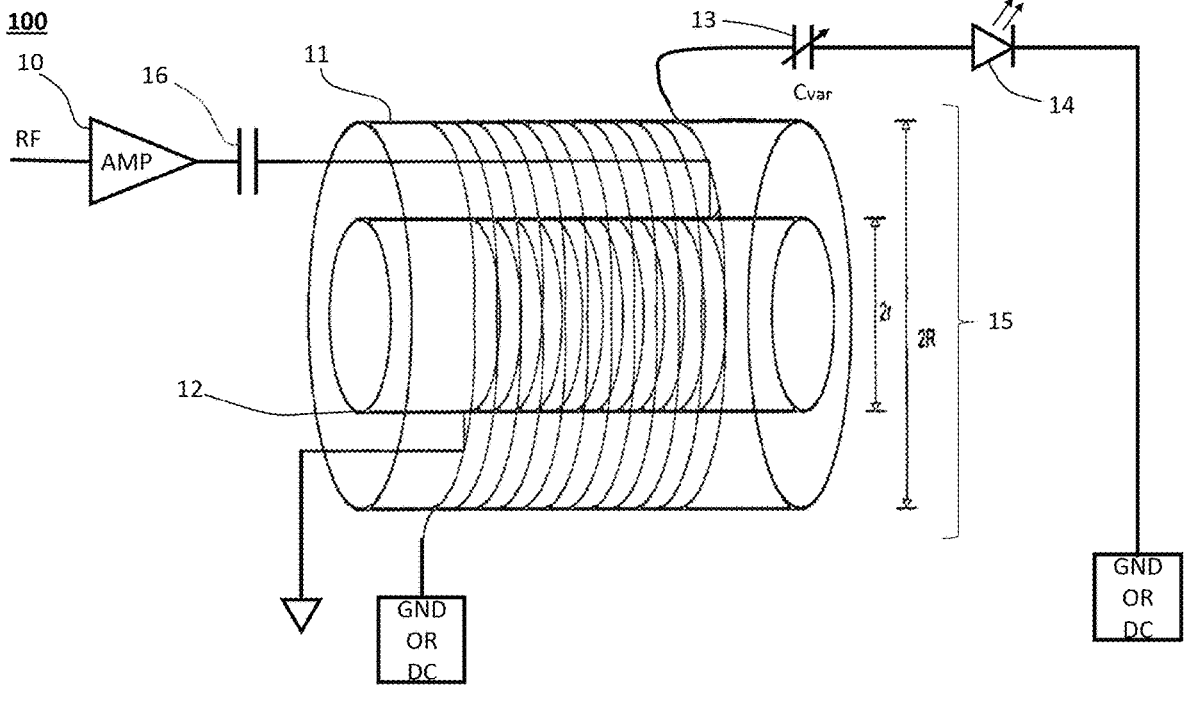
FIGS. 1A and 1B show examples of various aspects of the disclosure relating to the use of parallel coil capacitive coupling.
Figure 1B:
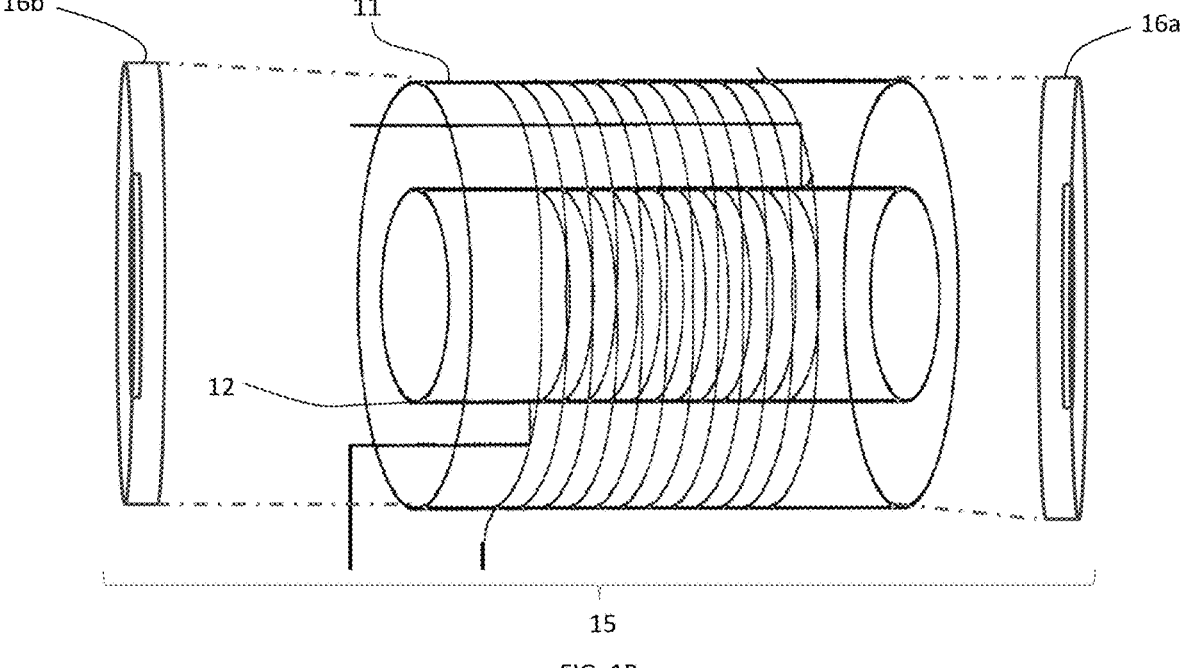

FIGS. 1A and 1B show examples relating to a first type of coupling system 100 according to various aspects of the present disclosure. As shown in FIG. 1A, a typical system 100 may involve coupling an RF signal (or other analog or digital signal; hereinafter referred to simply as "RF signal") to a light energy emitting diode 14. The RF signal may be amplified by an RF (or other appropriate) amplifier 10. The amplified RF signal may then be provided as input to a concentric parallel coil capacitance 15, having inner 12 and outer 11 coils of respective radii r and R, with r<R; note that a DC blocking capacitor 16 may be provided between the amplifier and the parallel coil capacitance 15. The coils 11, 12 may be wound tightly around respective non-conductive, non-magnetic tubular cores such that there is substantially no space between adjacent turns of each coil 11, 12; the windings may comprise insulated wire, e.g., but not limited to, insulated copper, silver, or gold wire. The coils 11, 12 may be separated by air ("an air core") or by some other dielectric material. According to one aspect of the present disclosure, the amplified RF signal may be fed to inner coil 12, which may be connected to ground at its other end; inner coil 12 may be matched to the output impedance (e.g., 50Ω) of the amplifier 10 (in fact, in all examples below, the input impedance of the capacitive element may be matched to the output impedance of the device that feeds it). Outer coil 11 may be connected to ground or to a direct current (DC) source at one end, and the other end may be coupled to an input of a variable capacitor ($C_{var}$) 13, which may act as a tuning capacitor (note that according to other aspects of the present disclosure, this may be a fixed capacitor, which may also act as a tuning capacitor, or there may be both a fixed capacitor and a variable capacitor). The output of variable capacitor 13 may feed the light energy emitting diode 14, whose other contact may be connected to ground or a DC source. Variable capacitor 13 may be manually or automati-cally adjusted to maximize output power from diode 14; this may be done, for example, by monitoring the light energy output from diode 14 or the output from the amplifier 10 and using a measured value as a feedback input to a user display or to a comparator that may compare the output measure-ment with a previous output measurement and may determine an adjustment to the variable capacitor 14 based on the comparison result (e.g., by controlling a mechanical adjuster, e.g., using a motor). Alternatively, this may be done by monitoring the analog or digital or RF signal energy using an energy and/or amplitude detector and using a measured value as a feedback input to a user display or employing a comparator (or other comparison device) that may compare a measured value with a previous measured value and may determine an adjustment to the variable capacitor 14 based on the comparison result.

Referring to FIG. 1B, in the case in which the capacitive coil structure 15 has an air core, some type of structure may be needed to maintain the inner 12 and outer 11 coils separated from each other. According to one aspect of the present disclosure one or two caps 16a, 16b may be fitted to the coils 11, 12 at one end or at both ends, where the cap(s) may be sufficiently supportive of the coils 11, 12 to maintain their distance from one another. In the case of using a single cap, that cap may need to fit sufficiently deeply onto and/or into the coils 11, 12 so as to be able to support the coils 11, 12 without the use of a second cap or other structure. The cap or caps 16a, 16b may be composed of a non-conductive, non-magnetic material, such as, but not limited to, a plastic or ceramic material. The cap or caps 16a, 16b need not fully cover the entire end of the coil structure 15; rather, there may be holes or other openings in the caps, which may permit the passage of wires for various couplings shown in FIG. 1A and/or for other purposes (e.g., dissipation of heat that may result from parasitic resistance and/or inductance).

Structures other than caps 16a, 16b, such as non-conductive, non-magnetic structural crosspieces (not shown), may be used to maintain separation between the coils 11, 12.

The capacitive structure 15 of FIGS. 1A and 1B is useful for signals of a frequency range up to about 150 MHz. However, above about 150 MHz, parasitic impedances (inductive and resistive) begin to become substantially more inductive, resulting in lower capacitive coupling efficiency, increased power dissipation, and loss of impedance matching. Consequently, it may be useful to use a different structure for the capacitive structure.

Figures 2A, 2B:
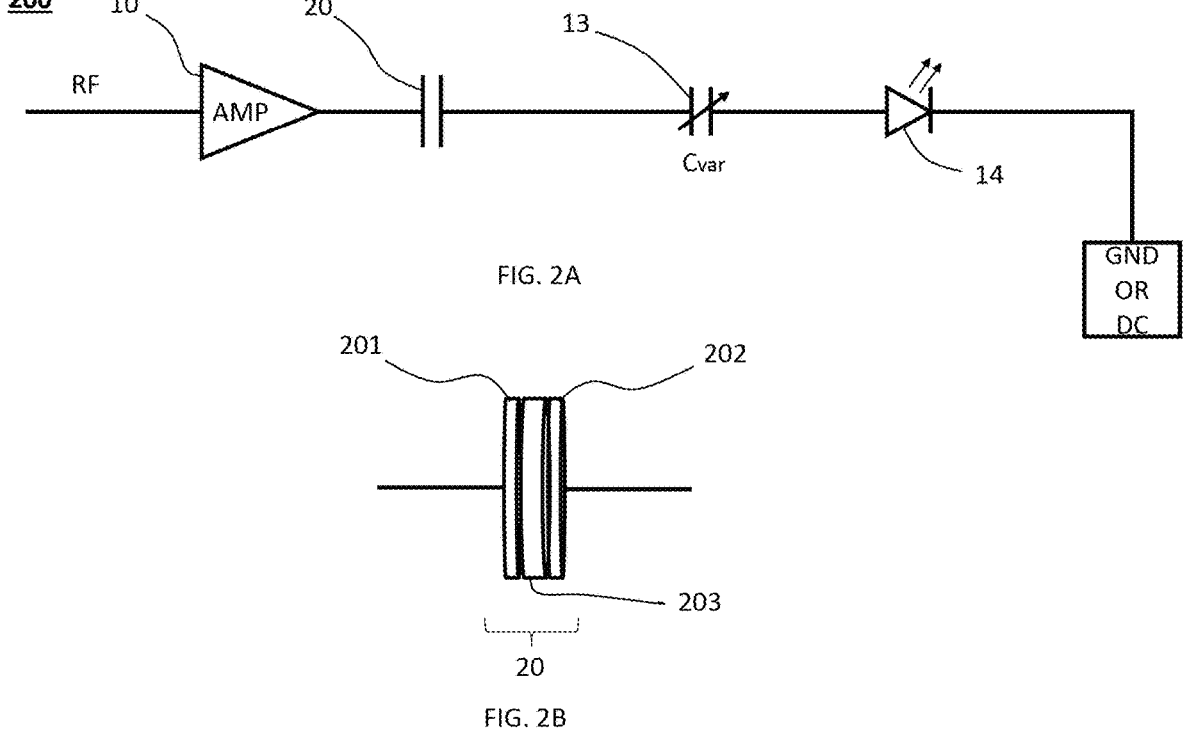
FIGS. 2A and 2B show examples of various aspects of the disclosure relating to the use of parallel plate capacitive coupling.

FIGS. 2A and 2B illustrate a first alternative capacitive coupling structure 200 according to further aspects of the present disclosure. Above 150 MHz, and in particular above 750 MHz, a parallel plate capacitive element 20 may be used instead of the concentric parallel coil capacitive element 15 (a further alternative, using wound plate coils is explained in conjunction with FIG. 5, which may be useful in the range between 150 MHz and 750 MHz; a further parallel plate structure is also discussed below in conjunction with FIG. 6). As shown in FIG. 2A, similar to FIG. 1A, the capacitive element 20 may be followed by a variable capacitor 13 that may be used to adjust and optimize the capacitive coupling, as discussed above. Parallel plate capacitive element may be implemented as a parallel plate capacitor, as shown in FIG. 2B or FIG. 6. Parallel plates 201, 202, each having a contact to which to connect the parallel plate capacitor 20 in a system. The parallel plates 201, 202 may be separated by a dielectric 203, which may be air, ceramic, or some other dielectric material. The shapes and areas of the parallel plates 201, 202 may be selected, according to known principles of physics, to optimize coupling, e.g., based on the desired operating frequency band, to minimize spurious effects (e.g., parasitic resistance and/or inductance), etc.

Figure 3:
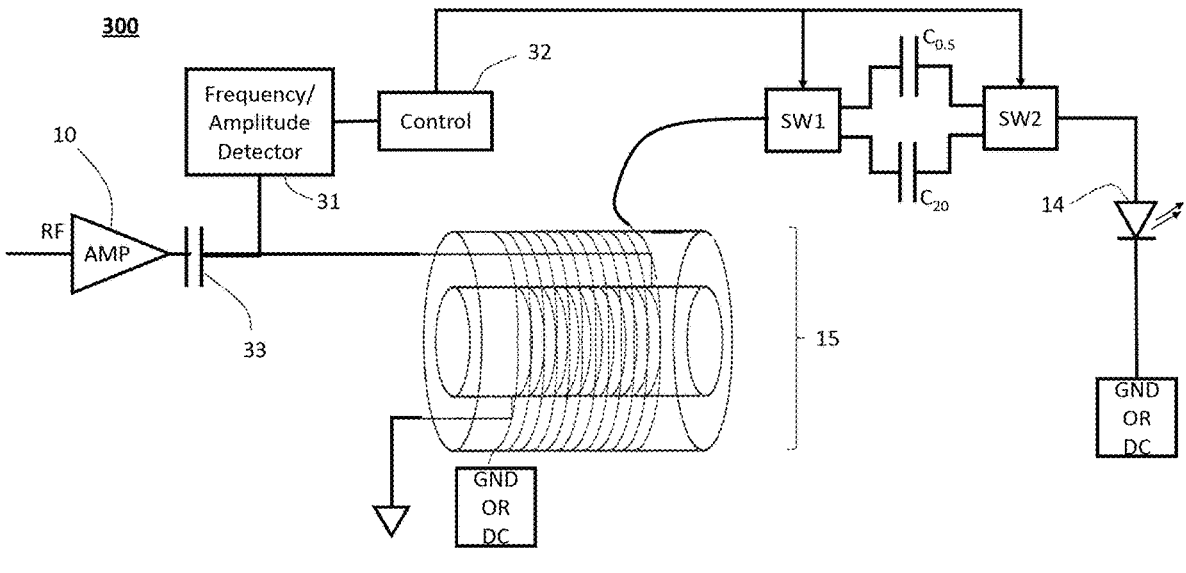
FIG. 3 shows an example of a system that incorporates switching between capacitances/impedances of different values.

In the case of, for example, a laser diode, there may be different states having different input impedances. For example, a laser diode may have an initial start-up input impedance of 20Ω and a post-activation input impedance of 0.5Ω. As explained above in the general case, failure to match impedances may result in significant power loss. FIG. 3 shows an example implementation of a system 300 with a coupler that switches between matching diode input impedances of 0.5Ω and 20Ω. As in the previous case, an input signal may be amplified by an appropriate amplifier 10, which may be followed, optionally, by a DC blocking capacitor 33. The amplified output (following the blocking capacitor, if used) may then be fed to a parallel coil capacitive element 15, whose output may be switched between (capacitive) impedances $C_{0.5}$ and $C_{20}$ designed to match the two input impedance states of diode 14. Switches SW1 and SW2 may be controlled such that the signal is routed through the appropriate one of the impedances. Control may be performed automatically, e.g., via frequency/amplitude detector 31 and control logic 32. Frequency/amplitude detector may detect a frequency of the (amplified) input signal, as well as an amplitude of the signal. Impedance mismatch may cause the amplitude to vary, and the control logic 32 may use at least one comparator (for example) to determine whether the amplitude indicates that the impedance into the diode 14 is not being matched by the impedance presently switched into the system and may generate a control signal that may be fed to the switches SW1 and SW2 to select use of the other impedance.

Figure 4:
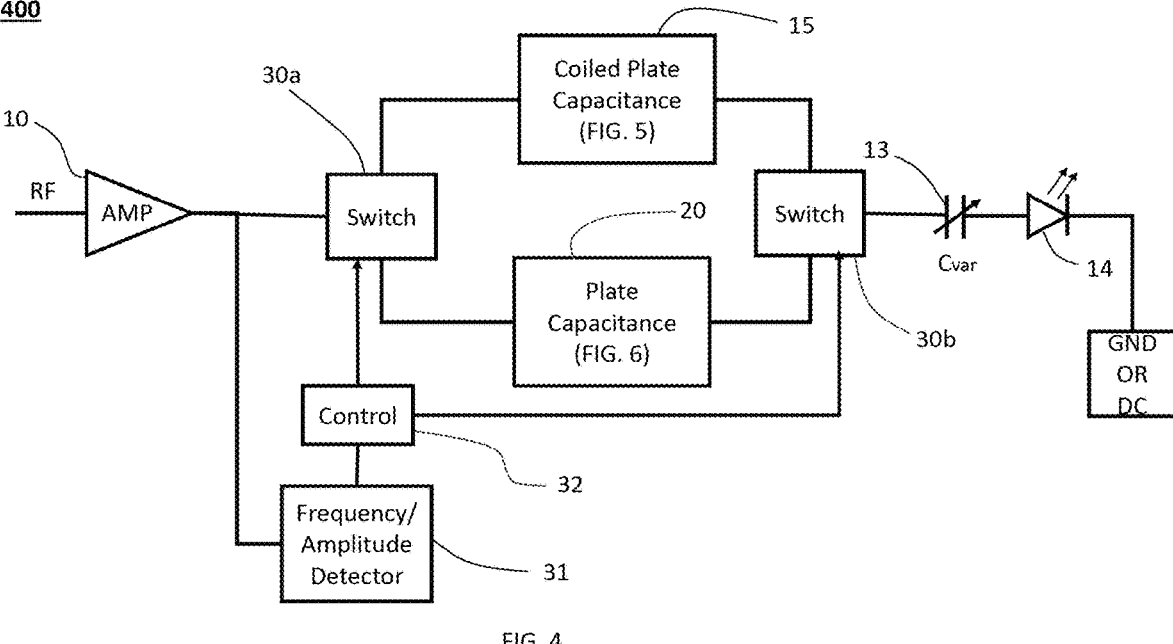
FIG. 4 shows an example of a system that may incorporate parallel coil and parallel plate capacitive coupling, according to various aspects of the present disclosure.

In some scenarios, the frequency of signals to be coupled to the light energy emitting diode 14 may not be the same at all times and may vary beyond the ranges at which the respective structures of the capacitive elements of FIGS. 1A and 2A are better. In view of this, FIG. 4 presents a system 400 in which both types of capacitive components 15, 20 are incorporated. The amplified signal from the output of amplifier 10 (which may be followed by a DC blocking capacitor (not shown)) may be input to a switch 30. Switch 30 may be a manual switch or may be controlled automatically. The implementation may depend on whether it is anticipated that the input frequency may vary suddenly or may remain within one of the ranges of the two different capacitive structures 15, 20 for times during which a person would be able to manually operate switch 30 to correctly route the input to the correct structure. If it is anticipated that the input signal frequency may vary quickly and/or frequently, switch 30 may incorporate an electrical input to control switching between the inputs to capacitive structures 15, 20. This may be implemented, for example, by coupling a frequency/amplitude detector 31 to the input or output signal of the RF amplifier 10. Frequency/amplitude detector 31 may detect a frequency or frequency and amplitude of the input signal and may automatically generate a control signal to send to switches 30a, 30b to determine how the input signal should be routed. Otherwise, the remainder of the apparatus of FIG. 3 may comprise the variable capacitor 13 and light energy emitting diode 14 as in FIGS. 1A and 2A. Note that, according to a further aspect of the present disclosure, it may also be possible to use a fixed capacitor to provide a 0.5Ω impedance at the diode input all the time.

In some examples, light energy emitting diode 14 may comprise an optical diode for optical frequency communications, e.g., via fiber-optic cable or free space. In this use case, the input signal to be coupled to the diode 14 may be a relatively high-frequency signal, e.g., with one or more carrier frequencies exceeding 150 MHz. In this case, to obtain the better efficiency, a parallel plate capacitive coupler 20 (or the examples of FIGS. 5 and/or 6) may be the better choice.

In other examples, light energy emitting diode 14 may comprise a laser diode for use, for example, in laser tools (e.g., for cutting or burning), laser-based defense apparatus, using high power (e.g., for air defense), or long-distance power transmission (e.g., for space-based applications). Such lasers may generally be relatively high-powered and may be operated in a pulsed fashion; but the pulse rate may generally be below 150 MHz. In such cases, the parallel concentric coil capacitive element 15 may be the better choice (except in cases where the pulse rate may exceed 150 MHz, in which case the example of FIG. 5 below may be more effective). The parallel concentric coil capacitive element 15 may also be useful in operating light-emitting diode (LED) lightbulbs, as it may result in reduced power consumption via better impedance matching, which may serve to decrease energy dissipation in the form of heat (other applications of LEDs and light energy emitting diodes, in general, to which the details of this paragraph apply may include, for example, calibrating a telescope, measuring distance to an object (even a celestial object, like the moon) to which a mirror is affixed, x-ray lasers, and laser surgical equipment).

Figure 5:
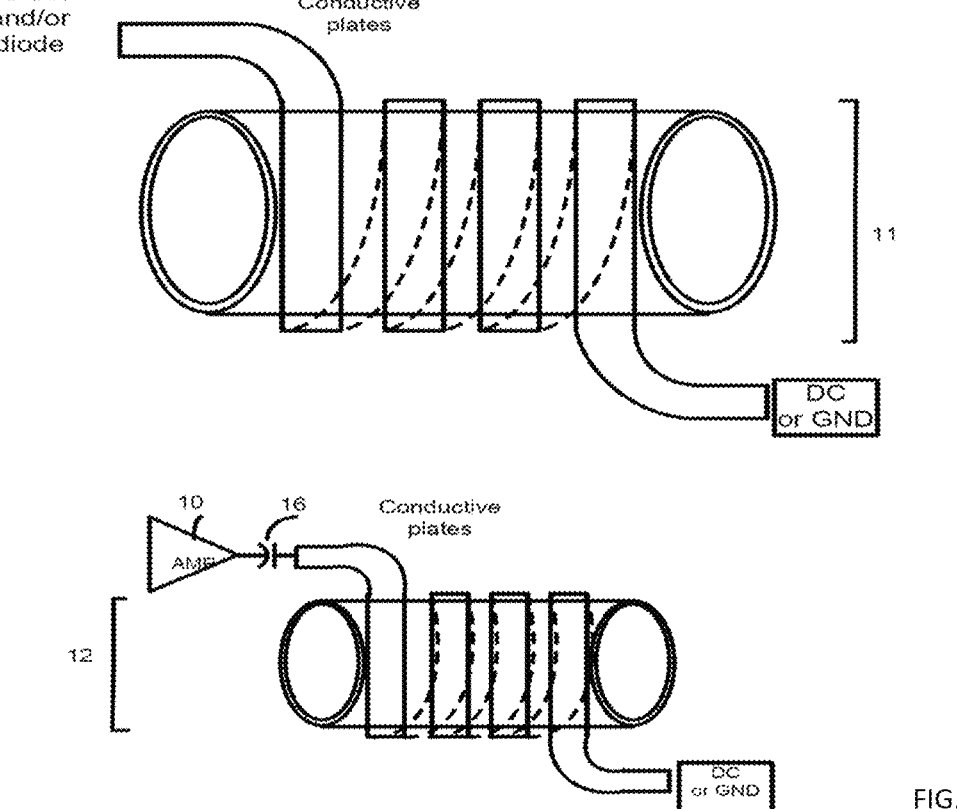
FIG. 5 shows an example of a further capacitive element according to various aspects of the present disclosure.
Figure 6:
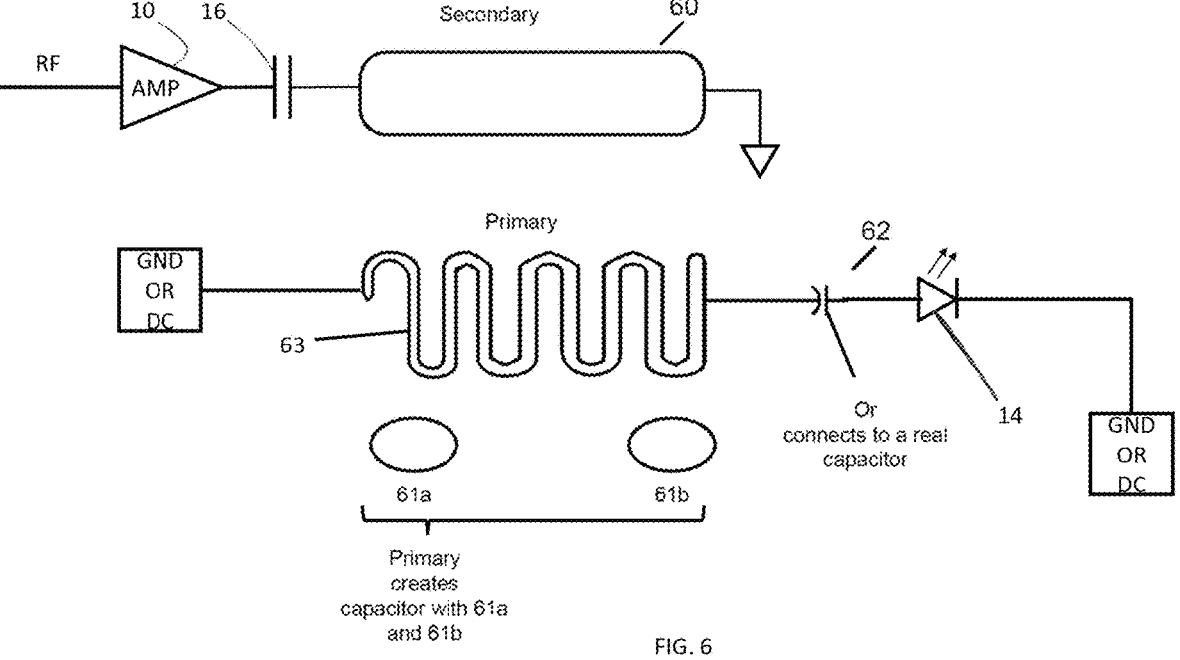
FIG. 6 shows an example of a parallel plate capacitive element according to various aspects of the present disclosure.

FIGS. 5 and 6 present example alternatives for use with input signal frequencies exceeding 150 MHz. In the alternative of FIG. 5, the parallel coil capacitive element concept, as in previous examples, may continue to be used; however, as frequency increases beyond about 150 MHz the wire coils used in previous examples may become self-inductive, leading to mismatch and power loss. Therefore, according to the example of FIG. 5, the wire coils may be replaced with coiled conductive plates, which may be used for both inner coil 12 and outer coil 11. The conductive plates may be formed of a conductive material, such as, but not limited to, copper, silver, or gold or a silver- or gold-plated material. If the conductive plates are coated with an insulator, they may be tightly wound, similarly to the case of wire coils. However, this may not be the case, meaning that the coils may need to be separated from one another, either by not being tightly wound (which may work for higher frequency signals) or by a helical projection formed of an insulating material on or as part of the tube around which the conductive plate is coiled or some similar structure composed of an insulating material, e.g., ceramic, on or as part of the tube. In this case of needing to separate the coils, the conductive plate may be wound within the helical projection/between insulating structures (not shown) such that the helical projection/structure(s) separates adjacent coils of the conductive plate. The helical projection or structure(s) may or may not be continuous, i.e., there may be gaps between sections, and the sections may be of arbitrary size(s). The coils 11, 12 may be connected as in any of the previous examples using parallel coil capacitive elements.

When the input signal frequency exceeds approximately 750 MHz, the example of FIG. 6 may provide improved performance over the example of FIG. 5. The structure of FIG. 6 may be of a chip size, e.g., even as small as 1 mm×1 mm. The structures 60, 61a, 61b, 63 shown in FIG. 6 may be formed within/surrounded by non-conductive, non-magnetic material within a chip-like package. If the frequencies for which the structures are designed is around 750 MHz, the package may be about one inch long; but as the frequencies for which the structure is designed increase, the structure size/package size may be smaller. Structure 63 may correspond to the inner (primary) coil of the previous examples and may be formed of coiled conductive plate, as in the example of FIG. 5, which may be composed of, for example, but not limited to, copper, silver, or gold; however, structure

63 may be formed as a "wavy plate," rather than as a coil around a tube. It is noted that other shapes may be used, as long as the resulting impedances are properly matched to the amplifier and to the diode. These plate shapes may be one-dimensional and can form any shapes as long as they are designed to match the diode impedance. The primary shape may be disposed on one side of a circuit board and the other secondary shape may be disposed on the opposite side of the circuit board. Structure 63 may be connected, as in the previous examples, between the (amplified) input signal and ground or DC. Components 60, 61a, 61b may be conductive plates of various sizes and/or shapes, which may be composed of the same material as the coiled conductive plate 11. Plate 60 may be of a length approximately equal to the length of structure 63. Plates 61a, 61b may typically be much smaller, as shown in FIG. 6. These plates 61a, 61b may, in combination with structure 63, form capacitors. According to a further aspect of the present disclosure, plates 61a, 61b may be replaced by a capacitor 62 whose output is directed into the diode (not shown). In general, the higher the frequency of intended use, the smaller the structures 60, 61a, 61b, 63 may be made.

It is noted that the example of FIG. 4 may be adapted to include three different capacitive coupling structures that are optimized for three different frequency ranges and to use three-way switches controlled by a control signal that may be generated by control logic based on a frequency range of the input signal to the capacitive structures (i.e., to the switches). The control logic in this case may comprise multiple comparator elements or alternatively a frequency/amplitude detector. In further examples, this may be extended beyond three capacitive elements.

In general, the dimensions of the various components of the capacitive elements shown in the drawings and described above may take various dimensions, which may be determined based on use cases, which may, in particular, correspond to the power and frequency of intended use. Higher power and/or lower frequency may generally indicate the use of larger components, and vice versa. One skilled in the art would be capable of recognizing different scenarios in which different component sizes may be used and would be able to adapt the different components using, e.g., principles of physics.

Various aspects of the disclosure have been presented above. However, the invention is not intended to be limited to the specific aspects presented above, which have been presented for purposes of illustration. Rather, the invention extends to functional equivalents as would be within the scope of the appended claims. Those skilled in the art, having the benefit of the teachings of this specification, may make numerous modifications without departing from the scope and spirit of the invention in its various aspects.

What is claimed is:

1. A light emitting, optical, or laser diode-based system including:

a coupling device coupled between a radio-frequency (RF), analog, or digital input signal and an input to a light emitting, optical, or laser diode, the coupling device including:

a first fixed capacitive element, wherein the first fixed capacitive element comprises a pair of parallel concentric coils, wherein the RF, analog, or digital input signal is arranged to be coupled to a first one of the pair of coils, and wherein a second one of the pair of coils is arranged to provide an output signal to the variable capacitive element or the second fixed capacitive element; and a tuning capacitive element, comprising a variable capacitive element or a second fixed capacitive element distinct from the first fixed capacitive element, wherein the tuning capacitive element is configured to cause the coupling device to substantially match an input impedance of the light emitting, optical, or laser diode, and wherein an input impedance of the coupling device is configured to match an output impedance of a component providing the RF, analog, or digital input signal.

2. The system of claim 1, further including an amplifier providing the RF, analog, or digital input signal.

3. The system of claim 1, wherein each of the parallel concentric coils comprises wire wound around a respective non-conductive, non-magnetic tubular core with substantially no space between windings within a coil.

4. The system of claim 1, wherein the first fixed capacitive element further comprises a dielectric disposed between the pair of parallel concentric coils.

5. The system of claim 4, wherein the dielectric is air.

6. The system of claim 1, wherein the coils of the respective concentric parallel coils comprise conductive plates wound around respective non-conductive, non-magnetic tubular cores.

7. A light emitting, optical, or laser diode-based system including:

a coupling device coupled between a radio-frequency (RF), analog, or digital input signal and an input to a light emitting, optical, or laser diode, the coupling device including:

a first fixed capacitive element; and a tuning capacitive element, comprising a variable capacitive element or a second fixed capacitive element distinct from the first fixed capacitive element, wherein the tuning capacitive element is configured to cause the coupling device to substantially match an input impedance of the light emitting, optical, or laser diode, and wherein an input impedance of the coupling device is configured to match an output impedance of a component providing the RF, analog, or digital input signal, wherein the first fixed capacitive element comprises a pair of parallel conductive plates, wherein a first one of the plates is arranged to be coupled to the RF, analog, or digital input signal, and wherein a second one of the plates is arranged to provide an output signal to the variable capacitive element or the second fixed capacitive element.

8. The system of claim 7, wherein the first fixed capacitive element further comprises a dielectric disposed between the pair of parallel conductive plates.

9. The system of claim 8, wherein the dielectric is air.

10. The system of claim 7, wherein the second one of the plates has an arbitrary shape such that it serves to substantially match the input impedance of the light emitting, optical, or laser diode.

11. The system of claim 1, wherein the variable capacitive element is arranged to be adjusted automatically.

12. A light emitting, optical, or laser diode-based system including:

a coupling device coupled between a radio-frequency (RF), analog, or digital input signal and an input to a light emitting, optical, or laser diode, the coupling device including:

a first fixed capacitive element; and a tuning capacitive element, comprising a variable capacitive element or a second fixed capacitive element distinct from the first fixed capacitive element, wherein the tuning capacitive element is configured to cause the coupling device to substantially match an input impedance of the light emitting, optical, or laser diode, and wherein an input impedance of the coupling device is configured to match an output impedance of a component providing the RF, analog, or digital input signal, wherein the first fixed capacitive element comprises:

a first capacitive element and a second capacitive element, wherein the first capacitive element comprises a pair of parallel concentric coils, wherein the coils are formed of conductive plates, wherein the RF, analog, or digital input signal is arranged to be coupled to a first one of the pair of coils, and wherein a second one of the pair of coils is arranged to provide an output signal to the variable capacitor, and wherein the second capacitive element comprises a pair of parallel conductive plates, wherein a first one of the plates is arranged to be coupled to the input signal, and wherein a second one of the plates is arranged to provide an output signal to the variable capacitive element or the second fixed capacitive element;

a first switch coupled to receive the RF, analog, or digital input signal and to route it to either the first capacitive element or the second capacitive element; and a second switch coupled to receive an output from the first capacitive element or the second capacitive element and to provide an output signal to the variable capacitive element or the second fixed capacitive element.

13. The system of claim 12, further including:

a frequency detector coupled to receive as an input the RF, analog, or digital input signal, to detect a frequency or frequency range of the input signal, and to output a signal indicative of the detected frequency or frequency range of the RF, analog, or digital input signal; and control logic including at least one comparator, the control logic coupled to receive the signal indicative of the detected frequency or frequency range and arranged to generate a control signal coupled to control the first and second switches.

14. The system of claim 12, further including:

a frequency/amplitude detector coupled to receive as an input the RF, analog, or digital input signal, to detect at least an amplitude of the RF, analog, or digital input signal, and to output a signal indicative of the amplitude of the RF, analog, or digital input signal; and control logic including at least one comparator, the control logic coupled to receive the signal indicative of the detected amplitude of the input signal and arranged to generate a control signal coupled to control the first and second switches.

15. A light emitting, optical, or laser diode-based system including:

a coupling device coupled between a radio-frequency (RF), analog, or digital input signal and an input to a light emitting, optical, or laser diode, the coupling device including:

a first fixed capacitive element; and a tuning capacitive element, comprising a variable capacitive element or a second fixed capacitive element distinct from the first fixed capacitive element, wherein the tuning capacitive element is configured to cause the coupling device to substantially match an input impedance of the light emitting, optical, or laser diode, and wherein an input impedance of the coupling device is configured to match an output impedance of a component providing the RF, analog, or digital input signal, wherein the variable capacitive element comprises:

a first capacitive element having a first impedance; and a second capacitive element having a second impedance different from the first impedance and arranged in parallel with the first capacitive element.

16. A light-energy emitting diode-based system including:

a coupling device coupled between a radio-frequency (RF), analog, or digital input signal and an input to a light-energy emitting diode, the coupling device including:

a first fixed capacitive element, wherein the first fixed capacitive element comprises a pair of parallel concentric coils, wherein the RF, analog, or digital input signal is arranged to be coupled to a first one of the pair of coils, and wherein a second one of the pair of coils is arranged to provide an output signal to the variable capacitive element, wherein the coils of the respective concentric parallel coils comprise conductive plates wound around respective non-conductive, non-magnetic tubular cores; and a tuning capacitive element comprising a variable capacitive element or a second fixed capacitive element, distinct from the first fixed capacitive element, wherein the tuning capacitive element is configured to cause the coupling device to substantially match an input impedance of the light-energy emitting diode, and wherein an input impedance of the coupling device is configured to match an output impedance of a component providing the RF, analog, or digital input signal.

17. A light-energy emitting diode-based system including:

a coupling device coupled between a radio-frequency (RF), analog, or digital input signal and an input to a light-energy emitting diode, the coupling device including:

a first fixed capacitive element; and a tuning capacitive element comprising a variable capacitive element or a second fixed capacitive element, distinct from the first fixed capacitive element, wherein the tuning capacitive element is configured to cause the coupling device to substantially match an input impedance of the light-energy emitting diode, and wherein an input impedance of the coupling device is configured to match an output impedance of a component providing the RF, analog, or digital input signal, wherein the first fixed capacitive element comprises a pair of parallel conductive plates, wherein a first one of the plates is arranged to be coupled to the RF, analog, or digital input signal, and wherein a second one of the plates is arranged to provide an output signal to the variable capacitor or the second fixed capacitive element.

18. The system of claim 15, wherein the variable capacitive element further comprises:

a first switch to direct a signal input to the variable capacitive element to either the first capacitive element or the second capacitive element; and a second switch, controlled in parallel with the first switch, to select as an output of the variable capacitive element an output of the one of the first capacitive element or the second capacitive element to which the signal is directed by the first switch.

* * * * *